United States Patent
Park et al.

(10) Patent No.: US 6,524,918 B2
(45) Date of Patent: Feb. 25, 2003

(54) METHOD FOR MANUFACTURING A GATE STRUCTURE INCORPORATING THEREIN ALUMINUM OXIDE AS A GATE DIELECTRIC

(75) Inventors: Dae-Gyu Park, Kyoungki-do (KR); Se-Aug Jang, Kyoungki-do (KR); Jeong-Youb Lee, Kyoungki-do (KR)

(73) Assignee: Hyundai Electronics Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 09/739,292

(22) Filed: Dec. 19, 2000

(65) Prior Publication Data

US 2001/0024860 A1 Sep. 27, 2001

(30) Foreign Application Priority Data

Dec. 29, 1999 (KR) ............................... 99-65030

(51) Int. Cl.$^7$ ............................................ H01L 21/336
(52) U.S. Cl. ........................................ 438/287; 438/591
(58) Field of Search ................................. 438/287, 591

(56) References Cited

U.S. PATENT DOCUMENTS 3,649,884 A * 3/1972 Haneta .................... 317/235 R
3,735,482 A * 5/1973 Norris et al. .................. 29/571
3,853,496 A * 12/1974 Kim .............................. 29/571
3,900,352 A * 8/1975 Potter ......................... 148/187
4,297,782 A * 11/1981 Ito ................................ 29/571
4,906,328 A * 3/1990 Freeman et al. ............ 156/643
5,561,072 A * 10/1996 Saito ............................ 437/24
6,087,615 A * 6/2000 Schork et al. ......... 219/121.43
6,159,874 A * 12/2000 Tews et al. ................. 438/964
6,235,572 B1 * 5/2001 Kunitomo et al. .......... 438/240
6,287,965 B1 * 9/2001 Kang et al. ................. 438/648

* cited by examiner

*Primary Examiner*—John F. Niebling
*Assistant Examiner*—Angel Roman
(74) *Attorney, Agent, or Firm*—Finnegan, Henderson, Farabow, Garrett, & Dunner, L.L.P.

(57) ABSTRACT

A method for forming a gate structure begins by preparing a semiconductor substrate provided with an isolation region formed therein. An aluminum oxide ($Al_2O_3$) layer is deposited on top of the semiconductor substrate and then, silicon ions plasma doping is carried out. Thereafter, the $Al_2O_3$ layer doped with silicon ions is annealed in the presence of oxygen gas or nitrous oxygen to remove a metallic vacancy in the $Al_2O_3$ layer. Subsequently, a conductive layer is formed on top of the $Al_2O_3$ layer. Finally, the conductive layer is patterned into the gate structure.

13 Claims, 2 Drawing Sheets

METHOD FOR MANUFACTURING A GATE STRUCTURE INCORPORATING THEREIN ALUMINUM OXIDE AS A GATE DIELECTRIC

FIELD OF THE INVENTION

The present invention relates to a semiconductor device; and, more particularly, to a method for manufacturing a gate structure incorporated therein aluminum oxide ($Al_2O_3$) as a gate dielectric.

DESCRIPTION OF THE PRIOR ART

As is well known, a semiconductor device has been down-sized by a scale down of a design rule. Therefore, a gate oxide tends to rapidly approach 30 Å in thickness and below to increase the capacitance between a gate electrode and a channel region. However, the use of silicon dioxide as a gate dielectric is limited at this thickness and below. Once silicon dioxide ($SiO_2$) is formed to a thickness of less than 30 Å, direct tunneling may occur through the gate dielectric to the channel region, thereby increasing a leakage current associated with the gate electrode and the channel region, causing an increase in power consumption.

Since reducing the thickness of the gate dielectric inherently increases the gate-to-channel leakage current, alternative methods have been developed to reduce this leakage current while maintaining thin $SiO_2$ equivalent thickness. One of these methods is to use a high K dielectric material such as tantalum oxide ($Ta_2O_5$) as the gate dielectric materials to increase the capacitance between the gate and the channel.

However, if a poly-silicon is utilized as a gate electrode, the use of $Ta_2O_5$ for gate dielectric materials has a disadvantage in integrating the semiconductor device. That is, an undesired $SiO_2$ is formed at an interface between $Ta_2O_5$ and the poly-silicon, which, in turn, increases an equivalent oxide thickness. In order to overcome this problem, a barrier metal such as titanium nitride (TiN) is employed. However, the TiN makes a threshold voltage shift changed.

Therefore, there is still a demand for developing a high K dielectric as a gate oxide with excellent leakage current as well as a low interface state with both a gate electrode and a silicon substrate.

SUMMARY OF THE INVENTION

It is, therefore, an object of the present invention to provide a method for manufacturing a gate structure incorporated therein aluminum oxide as a gate oxide for use in a semiconductor device.

In accordance with one aspect of the present invention, there is provided a method for manufacturing a gate structure for use in a semiconductor device, the method comprising the steps of: a) preparing a semiconductor substrate provided with an isolation region formed therein; b) forming an aluminum oxide layer ($Al_2O_3$) on the semiconductor substrate; c) carrying out a Si+ plasma doping on the $Al_2O_3$ layer; d) annealing the $Al_2O_3$ layer doped with the silicon ions; e) forming a conductive layer on top of the $Al_2O_3$ layer; and f) patterning the conductive layer, thereby obtaining the gate structure.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 1 to 4 cross sectional views setting forth a method for manufacturing a gate structure 100 for use in a semiconductor device in accordance with a preferred embodiment of the present invention.

Figure 1:
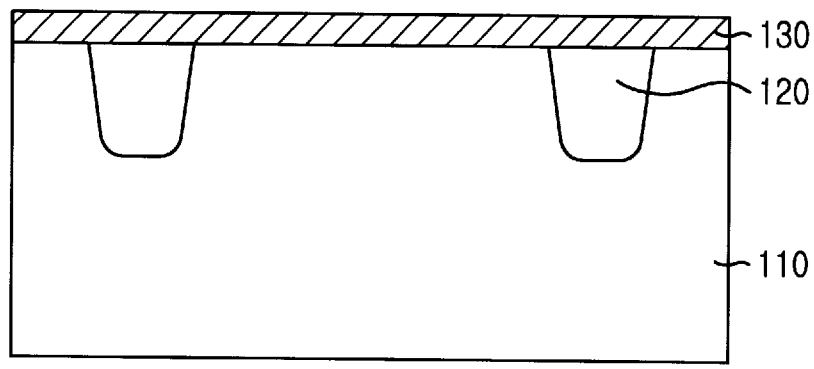
FIGS. 1, 2, 3, and 4 are schematic cross sectional views setting forth a method for the manufacture of a gate structure incorporated therein aluminum oxide as a gate dielectric in accordance with a preferred embodiment of the present invention.

Referring to FIG. 1, the process for manufacturing the gate structure 100 begins with the preparation of a semiconductor substrate 110 including an isolation region 120 for defining an active region. The isolation region 120 may be formed in a structure of local oxidation of silicon (LOCOS) or in a structure of shallow trench isolation (STI).

And then, an aluminum oxide ($Al_2O_3$) layer 130 is formed on top of the semiconductor substrate 110 by using a method such as a chemical vapor deposition (CVD) and an atomic layer deposition (ALD) technique, wherein an aluminum source utilizes a material such as trimethyl aluminum (TMA, $Al(CH_4)_3$, $Al(CH_3)_2Cl$, $AlCl_3$ or the like and an oxygen source utilizes a material such as $H_2O$, oxygen ($O_2$) or the like. It is preferable that the deposition temperature is ranged from 150 Å to 700 Å and the pressure in a reaction chamber is ranged from 0.5 Torr to 10 Torr.

Before depositing the aluminum oxide layer 130, a silicon dioxide ($SiO_2$) thin film (not shown) can be formed on the substrate 110. The $SiO_2$ thin film is thermally grown on the semiconductor substrate 110 by using a wet $H_2/O_2$ or dry $O_2$ at a temperature ranging from approximately 650° C. to approximately 900° C. It is preferable that the $SiO_2$ thin film has a thickness ranging from approximately 3 Å to approximately 20 Å. Alternatively, it is possible that the silicon $SiO_2$ thin film can be formed by using a rapid thermal process (RTP) at a temperature ranging from approximately 700° C. to approximately 900° C. in the presence of $O_2$ gas or a nitrous oxygen ($N_2O$) gas. It is preferable that the RTP is carried out in a pressure ranging from approximately 0.1 Torr to approximately 1.0 Torr.

Figure 2:
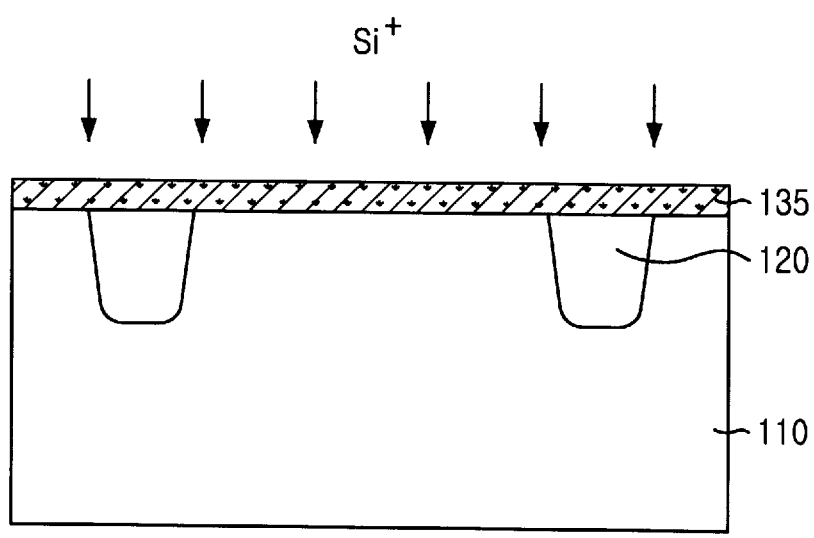
Figure 3:
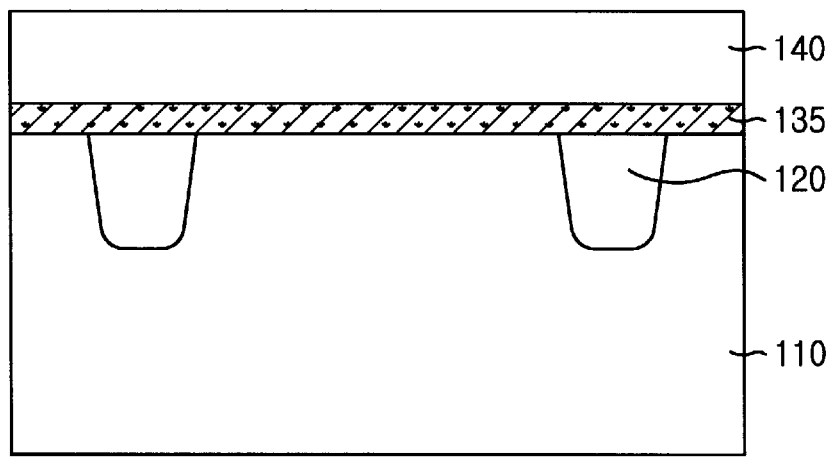

In a next step as shown in FIG. 2, in order to remove metallic vacancies in the aluminum oxide layer 130, silicon ions ($Si^+$) are doped by plasma. And then, a first annealing process is carried out, thereby forming an $Al_2O_3$ gate dielectric layer 135. In $Si^+$ plasma doping, Si RF coil, $SiH_4$, $Si_2H_6$, $SiCl_4$ or the like is used as a silicon source material. In more detail, $Si^+$ plasma doping is carried out on condition that a negative bias is applied to a cathode with 100 eV to 2 keV, an ion flux is approximately 1E14 to approximately 5E15 ions/cm², used power is approximately 0.1 W/cm² and $Si^+$ dopant is doped into the aluminum oxide layer 130 by controlling a gas flow rate. Meanwhile, by-product, e.g., H, Cl or the like, which is produced during the plasma doping, can be removed by a collector to which a positive bias is applied or be removed by means of evacuation using a high vacuum pump.

Thereafter, an organic material in the $Al_2O_3$ gate dielectric layer 135 is removed by using a UV ozone ($O_3$) at 300 to 500° C. for 3 to 30 minutes. And then, a second annealing process is carried out at 650 to 850 ° C. for 10 to 60 minutes in $O_2$, nitrogen ($N_2$), $N_2+H_2$ (hydrogen), $N_2+D_2$ (deuterium) or $N_2O$ rich ambient, thereby reducing the metallic vacancies in the $Al_2O_3$ gate dielectric layer 135 due to a change of the silicon ions into $SiO_2$.

In an ensuing step, a conductive layer 140 is formed on top of the $Al_2O_3$ gate dielectric layer 135 to a thickness ranging from approximately 500 Å to approximately 2,000 Å. The conductive material can be selected from a group consisting of a doped poly-Si, amorphous-Si, W-polycide, Ti-polycide, Co-polycide, Mo-polycide, tungsten (W), tantalum nitride (TsN), tungsten nitride (WN), titanium nitride (TiN) or the like.

In the embodiment of the present invention, the conductive layer 140 is formed after the $Si^+$ plasma doping is completed. However, the $Si^+$ plasma doping process can be carried out after the conductive layer 140 is deposited to the thickness ranging from 100 Å to 300 Å.

Figure 4:
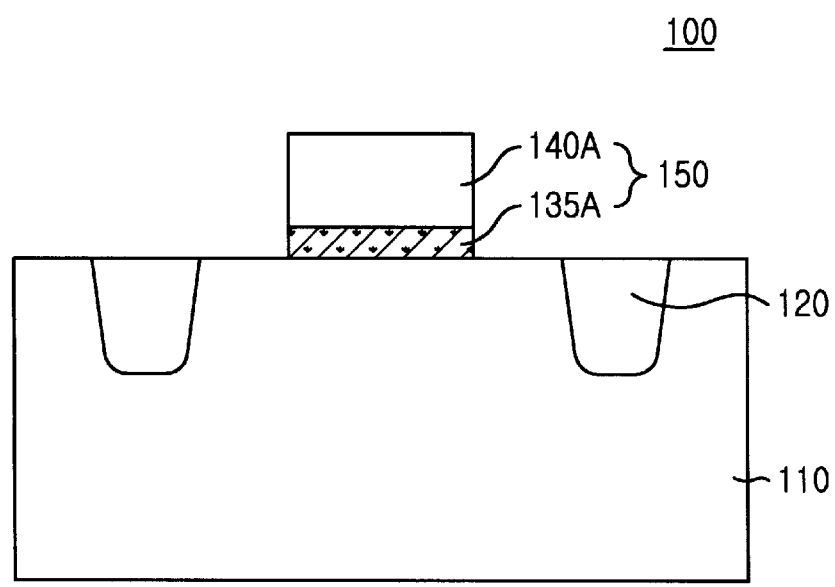

In a following step, the conductive layer 140A and the $Al_2O_3$ dielectric layer 135A are patterned into a predetermined configuration, thereby obtaining a gate structure 150 as shown in FIG. 4.

In the present invention, the aluminum oxide layer is used as the gate dielectric layer. And further, in order to reduce oxide trap charge produced by the metallic vacancies in the aluminum oxide layer, $Si^+$ plasma doping upon the aluminum oxide layer and the annealing process are carried out subsequently. By using the plasma doping in the inventive method, it is possible to control a projected range ($R_p$) from 50 Å to 200 Å while it is impossible in case of using an ion implantation method. Thus, the silicon ions are directly doped into the aluminum oxide layer so that the substrate is effectively prevented from the damage.

Accordingly, after $Si^+$ plasma doping, the silicon ions move into the vacancy site in the aluminum oxide layer and then $SiO_2$ is formed through the annealing process, thereby obtaining the gate structure incorporated therein the $Al_2O_3$ dielectric layer with a low oxide trap charge and enhanced dielectric property.

While the present invention has been described with respect to the particular embodiments, it will be apparent to those skilled in the art that various changes and modifications may be made without departing from the scope of the invention as defined in the following claims.

What is claimed is:

1. A method for manufacturing a gate structure for use in a semiconductor device, the method comprising:
   a) preparing a semiconductor substrate provided with an isolation region formed therein;
   b) forming an aluminum oxide ($Al_2O_3$) layer on the semiconductor substrate;
   c) carrying out $Si^+$ plasma doping on the $Al_2O_3$ layer;
   d) annealing the $Al_2O_3$ layer implanted with the silicon ions;
   e) forming a conductive layer on top of the $Al_2O_3$ layer; and
   f) patterning the conductive layer, thereby obtaining the gate structure.

2. The method as recited in claim 1, wherein said forming of an aluminum oxide layer includes forming the aluminum oxide layer at a temperature ranging from approximately 150° C. to approximately 700° C. and a pressure ranging from approximately 0.5 Torr to approximately 10 Torr by using a chemical vapor deposition (CVD) or an atomic layer deposition (ALD).

3. The method as recited in claim 2, wherein said forming an aluminum oxide layer uses an aluminum source including a material selected from trimethyl aluminum (TMA, $Al(CH_4)_3$), $Al(CH_3)_2Cl$ and $AlCl_3$, and an oxygen source of $H_2O$ or $O_2$.

4. The method as recited in claim 1, wherein said $Si^+$ plasma doping uses a silicon source, said silicon source selected from Si RF coil, $SiH_4$, $Si_2H_6$ and $SiCl_4$.

5. The method as recited in claim 4, wherein said conducted $Si^+$ plasma implanting includes conducting the $Si^+$ plasma implanting while applying a negative bias to a cathode with 100 eV to 2 keV, having an ion flux of approximately 1E14 to approximately 5E15 ions/cm$^2$, using power of approximately 0.1 W/cm$^2$, and implanting $Si^+$ dopant into the aluminum oxide layer by controlling a gas flow rate.

6. The method as recited in claim 1, wherein said annealing of the aluminum oxide ($Al_2O_3$) layer includes annealing out at a temperature of from approximately 650° C. to approximately 850° C. for from 10 to 60 minutes in ambient pressure with a gas selected from a group consisting of oxygen ($O_2$), nitrogen ($N_2$), $N_2+H_2$ (hydrogen), $N_2+D_2$ (deuterium) or nitrous oxygen ($N_2O$).

7. The method as recited in claim 1, further comprising the step of removing an organic material produced during the step of conducting a $Si^+$ plasma doping.

8. The method as recited in claim 7, wherein said removal of the organic material uses a UV ozone ($O_3$) at a temperature ranging from approximately 300° C. to approximately 550° C.

9. The method as recited in claim 1, wherein the conductive layer includes a material selected from a group of a doped poly-Si, amorphous-Si, W-polycide, Ti-polycide, Co-polycide, Mo-polycide, tungsten (W), tantalum nitride (TaN) tungsten nitride (WN) and titanium nitride (TiN).

10. The method as recited in claim 1, further comprising forming a silicon dioxide ($SiO_2$) thin film on the semiconductor substrate before forming the aluminum oxide ($Al_2O_3$) layer.

11. The method as recited in claim 10, wherein said forming of a silicon dioxide ($SiO_2$) thin film includes thermally growing the silicon dioxide ($SiO_2$) thin film on the semiconductor substrate to a thickness ranging from approximately 3 Å to approximately 20 Å using a wet $H_2/O_2$ or a dry $O_2$ at a temperature ranging from approximately 650° C. to approximately 900° C.

12. The method as recited in claim 10, wherein said forming of a silicon dioxide ($SiO_2$) thin film includes using a rapid thermal process (RTP) at a temperature ranging from approximately 700° C. to approximately 950° C. and a pressure ranging from approximately 0.01 Torr to approximately 100 Torr in $O_2$ or $N_2O$ gas ambient.

13. The method as recited in claim 1, wherein said preparing of a semiconductor substrate includes forming the isolation region using a local oxidation of silicon (LOCOS) or shallow trench isolation (STI).

* * * * *